United States Patent
Ivanov et al.

(10) Patent No.: US 6,930,551 B2
(45) Date of Patent: Aug. 16, 2005

(54) ZERO VOLTAGE CLASS AB MINIMAL DELAY OUTPUT STAGE AND METHOD

(75) Inventors: Vadim V. Ivanov, Tucson, AZ (US); David R. Spady, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/637,434

(22) Filed: Aug. 8, 2003

(65) Prior Publication Data

US 2005/0030097 A1 Feb. 10, 2005

(51) Int. Cl.[7] ................................................. H03F 3/18
(52) U.S. Cl. ....................................... 330/264; 330/269
(58) Field of Search ................................. 330/263, 264, 330/267, 268, 269, 277

(56) References Cited

U.S. PATENT DOCUMENTS

| | | | |
|---|---|---|---|
| 4,570,128 A | | 2/1986 | Monticelli .................... 330/267 |
| 5,894,236 A | * | 4/1999 | Mizoguchi et al. .......... 330/264 |
| 6,292,057 B1 | * | 9/2001 | Corsi et al. ................... 330/273 |
| 6,329,878 B1 | * | 12/2001 | Edwards et al. ............. 330/264 |

* cited by examiner

Primary Examiner—Khanh V. Nguyen
(74) Attorney, Agent, or Firm—W. Daniel Swayze, Jr.; W. James Brady; Frederick J. Telecky, Jr.

(57) ABSTRACT

A class AB output circuit includes a P-channel pullup transistor (M13) having a source coupled to a supply voltage, a drain coupled to an output(10), a gate coupled to respond to an input signal on an input(9), an N-channel pulldown transistor (M1) having a drain coupled to the output, a source coupled to ground, and a gate coupled to respond to the input signal. A first N-channel transistor (M2) has a drain coupled to a gate of the output transistor and the supply voltage by means of a current source (8) and a source coupled to ground by means of a second current source (13). A first diode-connected N-channel transistor (M3), a second diode-connected N-channel transistor (M4), and a first level shifting circuit (17) are coupled in series between ground and a gate of the N-channel transistor, and a current source (7) is coupled between the first supply voltage and the gate of the first N-channel transistor. A second level shifting circuit (18) is coupled between the gate of the pulldown transistor and the source of the first N-channel transistor.

19 Claims, 4 Drawing Sheets

ZERO VOLTAGE CLASS AB MINIMAL DELAY OUTPUT STAGE AND METHOD

BACKGROUND OF THE INVENTION

The present invention relates generally to class AB output stages of the type referred to as "Monticelli class AB output stages". More particularly, the present invention relates to an improved Monticelli class AB output stage which can operate reliably with a supply voltage of approximately 1.8 volts.

The closest prior art is believed to be disclosed in U.S. Pat. No. 4,570,128 issued Feb. 11, 1986 to Montecelli. "Prior Art" FIG. 1 herein shows the closest prior art disclosed in the Montecell patent. A Monticelli class AB output stage provides the fastest known "rail-to-rail" operation, but requires a minimum power supply voltage equal to the sum of 2 VGS (gate-to-source) voltages plus a VDSsat voltage, which is approximately 2.2 volts. Therefore, a typical Monticelli class AB output stage cannot be used in integrated circuits that require a lower power supply voltage of approximately 1.8 volts. Prior attempts to provide a class AB output stage which operates at lower power supplies have included negative feedback circuitry that unacceptably increases the overall loop delay.

Thus, there is an unmet need for an improved class AB output stage that reliably operates at high speed from a power supply voltage of approximately 1.8 volts.

There also is an unmet need for an output stage that is capable of sourcing and/or sinking substantial current and that is stable with any capacitive load while operating from a power supply voltage of approximately 1.8 volts.

SUMMARY OF THE INVENTION

It is an object of the present invention to provide an improved class AB output stage that reliably operates with minimal overall loop delay from an approximately 1.8 volt power supply It is another object of the present invention to provide an improved low-voltage voltage reference circuit that is capable of sourcing and/or sinking a substantial amount of current and that reliably operates from an approximately 1.8 volt power supply.

It is another object of the invention to provide an output stage that is stable with any capacitive load while operating from a power supply voltage of approximately 1.8 volts.

Briefly described, and in accordance with one embodiment, the present invention provides a class AB output circuit including an input terminal (9) and an output terminal (10), a P-channel first output transistor (M13) having a source coupled to a first supply voltage (VDD), a drain coupled to the output terminal (10), and a gate coupled to respond to an input signal (Vin) on the input terminal (9), and an N-channel second output transistor (M1) having a drain coupled to the output terminal (10), a source coupled to a second supply voltage (GND), and a gate coupled to respond to the input signal (Vin), a first N-channel transistor (M2) having a drain coupled to a gate of the first output transistor (M13) and also coupled to the first supply voltage (VDD) by means of a first current source (8 or R7) and a source coupled to the second supply voltage (GND) by means of a second current source (13 or M19). In accordance with the present invention, a first diode-connected N-channel transistor (M3), a second diode-connected N-channel transistor (M4), and a first voltage level shifting circuit (17) are coupled in series between the second supply voltage(GND) and a gate of the first N-channel transistor (M2). A current source (7, 18, or M44) is coupled between the first supply voltage (VDD) and the gate of the first N-channel transistor (M2). A second voltage level shifting circuit (18) is coupled between the gate of the second output transistor (M1) and the source of the first N-channel transistor (M2). The first voltage level shifting circuit (17) has a first terminal (+) coupled to a gate and drain of the first diode-connected N-channel transistor (M3) and a second terminal (−) coupled to a source of the second diode-connected N-channel transistor (M4). A gate and drain of the second diode-connected N-channel transistor (M4) are coupled to the gate of the first N-channel transistor (M2), and a source of the first diode-connected N-channel transistor (M3) are coupled to the second supply voltage conductor (GND).

In one embodiment, the first terminal (+) of the first voltage level shifting circuit (17) is connected directly to the gate and drain of the first diode-connected N-channel transistor (M3). In another embodiment of the first terminal (+) of the first voltage level shifting circuit (17) is indirectly coupled to the gate and drain of the first diode-connected N-channel transistor (M3) by means of an operational amplifier (21) having a first input (−) connected to the gate and drain of the first diode-connected N-channel transistor (M3) and a second input (+) connected to the first terminal (+) of the first voltage level shifting circuit (17) and an output coupled to provide feedback control of the voltage of the second (−) terminal of the first voltage level shifting circuit (17). In one embodiment, the input signal (Vin) is coupled directly to the gate of the second output transistor (M1). In another embodiment, the input signal (Vin) is coupled indirectly to the gate of the second output transistor (M1).

In one embodiment, the first voltage level shifting circuit (17) includes an operational amplifier (21) having a (−) input coupled to the gate and drain of the first diode-connected N-channel transistor (M3) and a (+) input coupled to the source of the second diode-connected N-channel transistor (M4), wherein the (+) input of the operational amplifier (21) is coupled to the source of the second diode-connected N-channel transistor (M4) by means of a first level shifting resistor (R2) having a first terminal coupled to the (+) input of the operational amplifier (21) and a second terminal coupled to the source of the second diode-connected N-channel transistor (M4), and the second voltage level shifting circuit (18) includes a second resistor (R1) having a first terminal coupled to the gate of the second output transistor (M1) and a second terminal coupled to the source of the first N-channel transistor (M2). A second N-channel transistor (M20) has a source coupled to the second supply voltage (GND), a drain coupled to the second terminal of the first voltage level shifting resistor (R2), and a gate coupled to an output of the operational amplifier (21). A third N-channel transistor (M19) has a source coupled to the second supply voltage (GND), a drain coupled to the second terminal of the second voltage level shifting resistor (R1), and a gate coupled to an output of the operational amplifier (21). The resistance of the second resistor (R1) tracks the resistance of the first resistor (R2) with respect to temperature and/or process variations.

In one embodiment, the invention provides a voltage reference circuit (20) including the class AB output circuit, a bandgap reference voltage circuit (32), and a feedback amplifier (30) including a first input (+) coupled to an output of the bandgap reference voltage circuit (32), a second input (−) coupled to receive a feedback signal (23) produced in response to an output voltage (Vout) on the output terminal (10), and an output coupled to produce the input signal (Vin) on the input terminal (9).

DETAILED DESCRIPTION OF THE PREFERRED EMBODIMENTS

Figure 2:
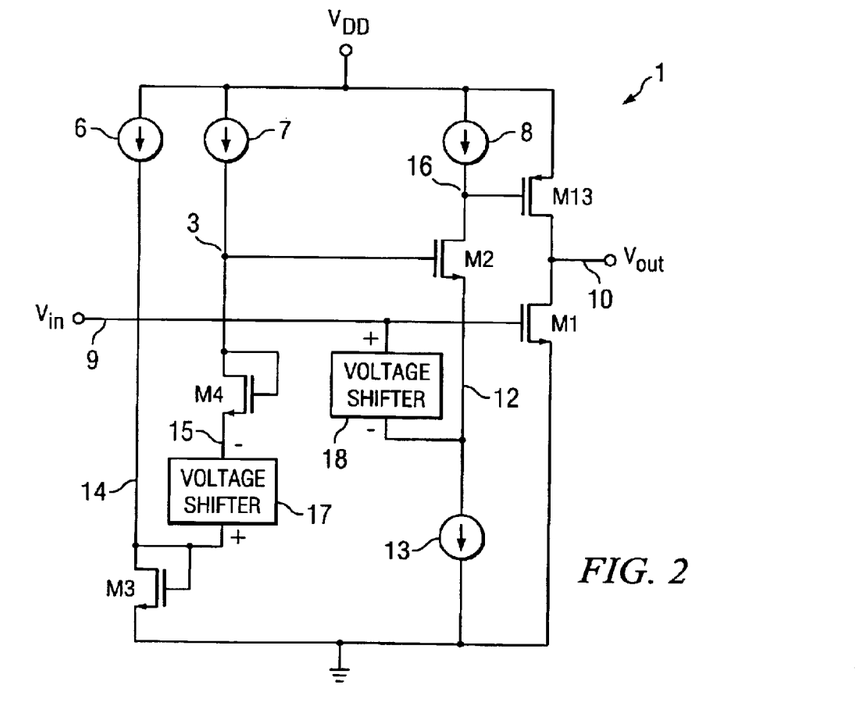
FIG. 2 is a simplified schematic diagram of an improved low voltage Monticelli class AB output stage of the present invention.

Referring to FIG. 2, a class AB output stage 1 of the present invention includes an input conductor 9 which applies an input voltage Vin to the gate of an N-channel pulldown transistor M1. The source of pulldown transistor M1 is connected to ground and its drain is connected to an output conductor 10 on which an output voltage Vout is produced. The drain of a P-channel pullup transistor M13 also is connected to output conductor 10. The gate of pullup transistor M13 is connected by conductor 16 to a junction between one terminal of a current source 8 and the drain of an N-channel transistor M2. The other terminal of current source 8 is connected to VDD. The source of transistor M2 is connected by a conductor 12 to one terminal of a current source 13, the other terminal which is connected to ground. A (+) terminal of a voltage shifter circuit 18 is connected to conductor 9, and a (−) terminal of voltage shifter 18 is connected to conductor 12. The gate of transistor M2 is connected by a conductor 3 to a junction between one terminal of a current source 7 and the gate and drain of a diode-connected N-channel transistor M4. The other terminal of current source 7 is connected to VDD. The source of diode-connected transistor M4 is connected to a (−) terminal of a voltage shifter 17, a (+) terminal of which is connected by means of a conductor 14 to the gate and drain of an N-channel transistor M3 and to one terminal of a current source 6, the other terminal of which is connected to VDD. The source of transistor M3 is connected to ground.

Figure 3:
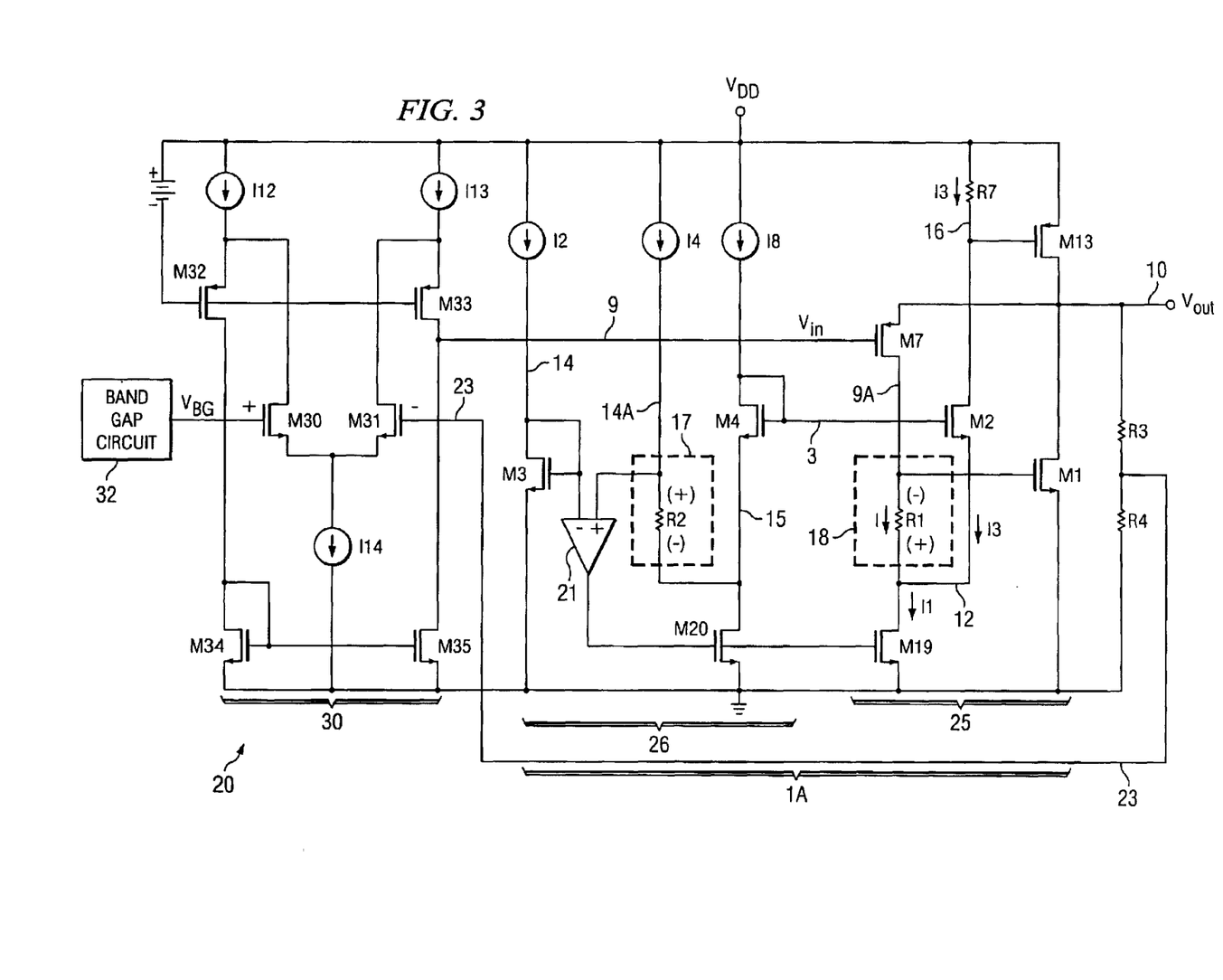
FIG. 3 is a detailed schematic diagram of a voltage reference circuit including another implementation of the improved low voltage Monticelli class AB output stage of the present invention.

FIG. 3 shows a voltage reference circuit 20 that includes a particular implementation 1A of the class AB output stage 1 of FIG. 2. Voltage reference circuit 20 includes a conventional bandgap circuit 32 which generates a bandgap voltage VBG that is applied to the (+) input of a feedback amplifier 30. The output of feedback amplifier 30 is produced on conductor 9 and is applied as the input voltage Vin to class AB output stage 1A. The output signal Vout produced by class AB output stage 1A on conductor 10 is applied as an input to a feedback network including feedback resistors R3 and R4. Feedback resistors R3 and R4 are coupled in series between output conductor 10 and ground. The junction between feedback resistors R3 and R4 is applied by a feedback conductor 23 to the (−) input of feedback amplifier 30.

Class AB output stage 1A includes pullup transistor M13 and pulldown transistor M1, as in FIG. 2. (Where appropriate, the same reference numerals used in FIG. 2 are also used in FIG. 3 and the other drawings to designate the same or similar components.) The gate of pullup transistor M13 is connected by conductor 16 to one terminal of a 300 kilohm resistor R7, the other terminal of which is connected to VDD. Conductor 16 also is connected to the drain of transistor M2, the source of which is connected by conductor 12 to one terminal of a level shift resistor R1 and the drain of an N-channel current mirror output transistor M19, the source of which is connected to ground. The other terminal of level shift resistor R1 is connected by conductor 9A to the gate of pulldown transistor M1 and to the source of a P-channel transistor M7. Level shift resistor R1, in cooperation with circuitry that forces the precise amount of current I through level shift resistor R1, constitutes voltage shifter 18 shown in FIG. 2.

The source of transistor M7 is connected to Vout, and its gate is connected to Vin conductor 9. As in FIG. 2, the gate of transistor M2 is connected by conductor 3 to the gate and drain of transistor M4 and also is connected to one terminal of a current source I8. The source of transistor M4 is connected by conductor 15 to the (−) terminal of voltage shifter 17, which is implemented by level shift resistor R2. Conductor 15 also is connected to the drain of an N-channel current mirror transistor M20, the source of which is connected to ground. The gates of current mirror transistors M19 and M20 are connected to the output of an operational amplifier 21, the (+) input of which is connected by conductor 14A to the (+) terminal of level shift resistor 17 and to one terminal of a current source I4. The (−) input of operational amplifier 21 is connected by conductor 14 to the gate and drain of transistor M3 and to one terminal of a current source I2. The source of transistor M3 is connected to ground.

The portion of class AB output stage 1A in FIG. 3 that includes the bias circuitry is designated by reference numeral 26. Resistor R2, in cooperation with current source I4 which forces a current I4 through resistor R2 to develop a level shift voltage across resistor R2, constitutes voltage source 17.

Feedback amplifier 30 includes a pair of source-coupled N-channel transistors M30 and M31. The gates of transistors M30 and M31 are connected to the (+) and (−) inputs, respectively, of feedback amplifier 30. The drain of transistor M30 is connected to the source of a P-channel transistor M32 and to one terminal of a current source I12. The drain of transistor M32 is connected to the drain and gate of a diode-connected N-channel current mirror control transistor M34, the source of which is connected to ground. The drain of transistor M31 is connected to the source of a P-channel transistor M33 and to one terminal of a current source I13. The gates of transistors M32 and M33 are connected to a suitable bias voltage source. The drain of transistor M33 is connected by conductor 9 to the drain of an N-channel current mirror output transistor M35, the source of which is connected to ground. The gate of current mirror transistor M35 is connected to the gate of current mirror control transistor M34. The sources of transistors M30 and M31 are coupled by a tail current source I14 to ground. The upper terminals of current sources I2, I4, I8, I12 and I13 are connected to VDD.

Figure 4:
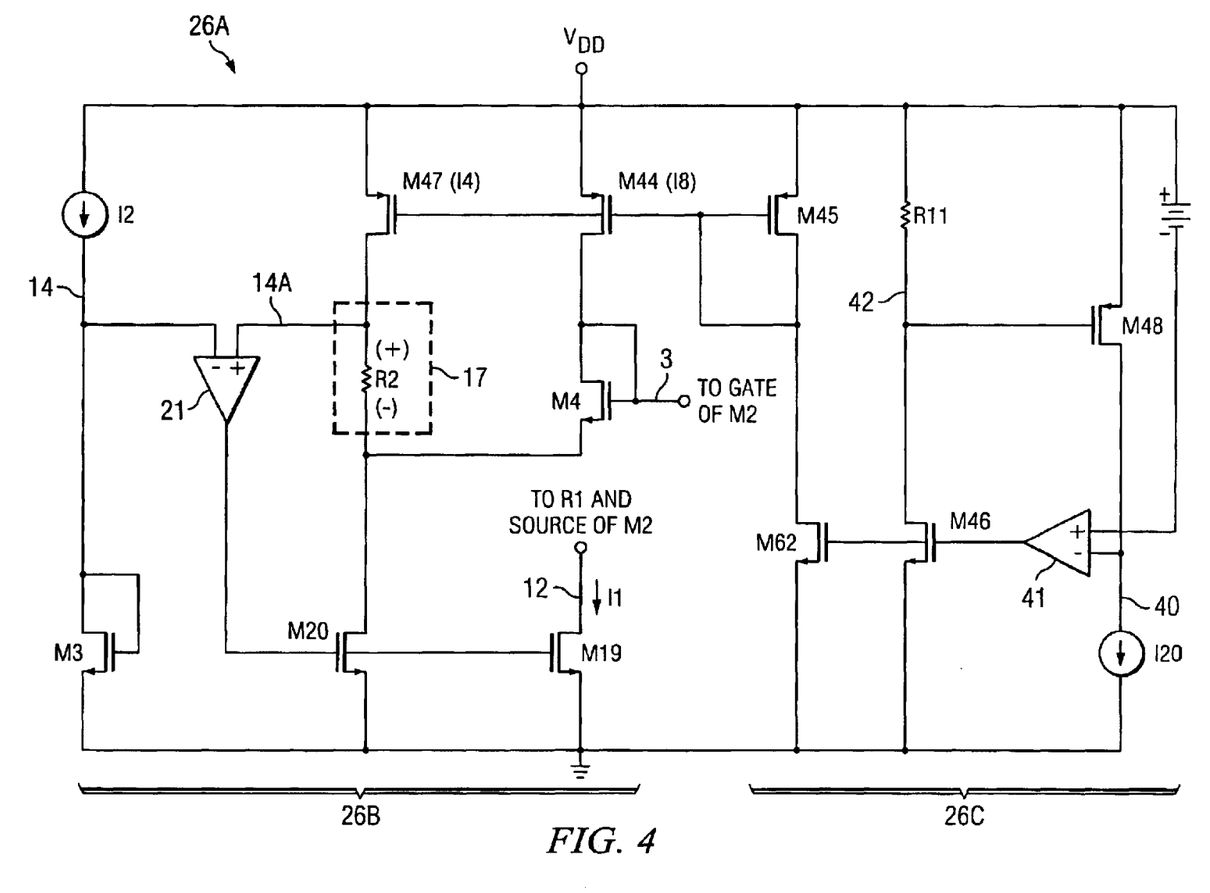
FIG. 4 is a detailed schematic diagram of a bias circuit for the low voltage class AB output stage included in FIG. 3.

FIG. 4 shows a detailed implementation 26A of the bias circuitry 26 in FIG. 3. Bias circuitry 26A includes a 300 kilohm resistor R11 that precisely matches resistor R1 in FIG. 3. Resistor R11 is connected between VDD and a conductor 42. Conductor 42 is connected to the gate of a P-channel transistor M48 that precisely matches pullup transistor 13 in FIG. 3. The drain of transistor M48 is connected by a conductor 40 to the (−) input of an operational amplifier 41 and to one terminal of a current source I20, the other terminal of which is connected to ground. The (+) input of operational amplifier 41 is connected to a suitable reference voltage source. The output of operational amplifier 41 is connected to the gates of N-channel transistors M62 and M46, the sources of which are connected to ground. The drain of transistor M46 is connected to conductor 42. The drain of transistor M62 is connected to the gate and drain of a diode-connected P-type current mirror control transistor M45, the source of which is connected to VDD.

The gate and drain of current mirror control transistor M45 is connected to the gates of P-channel current mirror output transistors M47 and M44, which correspond to current sources I4 and I8 in FIG. 3, respectively. The drain of transistor M44 is connected by conductor 3 to the gate and drain of transistor M44, as in FIG. 3. The drain of transistor M47 is connected by conductor 14A to the (+) terminal of level shift resistor R2 and to the (+) input of operational amplifier 21, as in FIG. 3. As shown in FIG. 3, conductor 3 is connected to the gate of transistor M2, and the drain of N-channel current mirror output transistor M19 is connected by conductor 12 to the (−) terminal of level shift resistor R1 (FIG. 3) and to the source of transistor M2 (FIG. 3). The (−) input of operational amplifier 21 is connected by conductor 14 to current source I2 and diode-connected transistor M3, as in FIG. 3.

Figure 5:
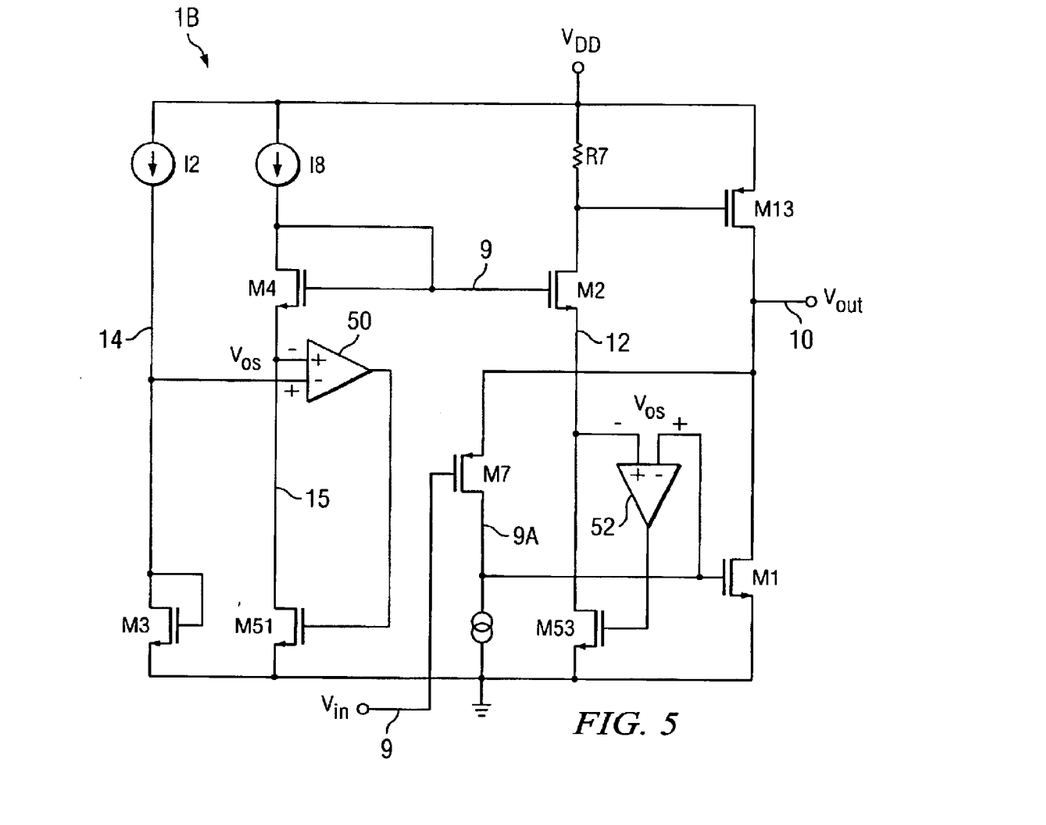
FIG. 5 is a schematic diagram of another embodiment of the low voltage class AB output stage of the present invention.

FIG. 5 shows an alternative embodiment 1B of the class AB output stage of FIG. 2 wherein the level shifters 17 and 18 include operational amplifiers with built-in offset voltages VOS that are equal to the desired amount of voltage level shift. The level shifter 17 shown in FIG. 2 is implemented in FIG. 5 to include an operational amplifier 50 which has its (+) input connected to conductor 15 and its (−) input connected to conductor 14. The output of operational amplifier 50 is connected to the gate of an N-channel feedback transistor M51 having its source connected to ground and its drain connected to conductor 15. The level shifter 18 shown in FIG. 2 as implemented in FIG. 5 includes an operational amplifier 52 having its (+) input connected to conductor 9A and its (−) input connected to conductor 12. The output of operational amplifier 52 is connected to the gate of an N-channel feedback transistor M53, the source of which is connected to ground and the drain of which is connected to conductor 12.

Figure 6:
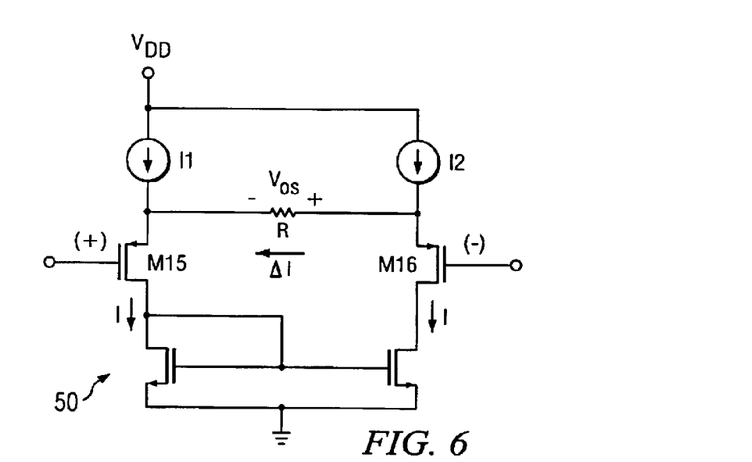
FIG. 6 is a schematic diagram illustrating an exemplary technique for implementing the built-in offset voltage of amplifiers 50 and 52 in FIG. 5.

The built-in offset voltage VOS can be easily provided by using various techniques, including the technique shown in FIG. 6. Referring to FIG. 6, the offset voltage VOS can be built into operational amplifier 50 by coupling the sources of input transistors M15 and M6 with a resistor R. Current sources I1 and I2 are coupled between VDD and the sources of transistors M15 and M16, respectively. A current mirror load circuit forces equal currents I to flow through transistors M15 and M16. A difference current ΔI equal to the difference between I2 and I1 therefore is forced to flow through resistor R, producing the built-in offset voltage VOS.

Bias circuit 26A of FIG. 4 includes a first part 26B which is essentially the same as a section of FIG. 3 indicated by reference numerals 26. Bias circuit 26A of FIG. 4 also includes a second section 26C which establishes control of current sources I4 and I8 so that they track with resistor R11 and P-channel transistor M48 over temperature variations and integrated circuit process variations. Bias circuit 26A of FIG. 4 also includes circuitry 26C which establishes control of current sources I4 and I8 so that they track with resistor 13 of FIG. 3. The current set up by resistor R11 and transistor M48 in FIG. 4 tracks the current set up by resistor R7, and transistor M13.

The input on conductor 9 to class AB output stage 1A can be equal to the temperature-independent voltage VBG produced by bandgap and feedback amplifier circuitry 32,30 shown in FIG. 3. The voltage on conductor 9 equal to VBG is applied to the gate of transistor M7, the source of which is connected to Vout. Vout is set to be equal to the bandgap output voltage VBG multiplied by (R3+R4)/R3 through the action of feedback resistors R3 and R4. The feedback from the junction 23 between feedback resistors R3 and R4 is fed back to the (−) input of feedback amplifier 30 and compared to VBG, which typically might be the approximately 1.2 volt output of a conventional bandgap circuit.

Operation of voltage reference circuit 20 of FIG. 3 can be explained in the following examples. First, assume that Vout is slightly higher than the above-indicated value VBG*(R3+R4)/R3. Then the (−) input of feedback amplifier 30 is higher than its (+) input. This causes the output voltage of feedback amplifier 30 to assume a reduced value, which lowers the gate voltage of transistor M7, increasing its VGS (gate-to-source) voltage. This causes increased current to flow through conductor 9A, which is connected to the gate of pulldown transistor M1 and raises the gate voltage of pulldown transistor M1 so it conducts more current from output conductor 10. That reduces Vout from its initial excessively high value.

Next, assume that Vout is slightly lower than the above-indicated value VBG*(R3+R4)/R3. Then the (−) input of feedback amplifier 30 is lower than the VBG value applied to the (+) input, causing the output voltage feedback amplifier 30 to raise the gate voltage of transistor M7. This reduces the gate voltage of transistor M1 and reduces the voltage of the source of transistor M2. The gate voltage of transistor M2 is constant, so when its source voltage is reduced, increased current flows through transistor M2, reducing the voltage on the gate of pullup transistor M13 and causing it to conduct more current. This tends to increase Vout from its initial excessively low value. Pulldown transistor M1 also conducts less current, and therefore also contributes to causing Vout to increase, although this effect is negligible.

The various embodiments of the class AB output stage all set the quiescent bias current through the pullup transistor M13 and pulldown transistor M1. The standard prior art Monticelli circuit (FIG. 1) includes a first section including two diode-connected transistors M3 and M4 connected to a current source I20 to establish a 2*VGS reference voltage on conductor 3. That voltage is applied to the gate of transistor M2, the source of which drives the gate of pullup transistor M13. The standard prior art Monticelli class AB circuitry also includes a second similar section to establish a 2*VGS reference voltage by means of diode-connected transistors M30 and M40 and current source I21 on the gate of transistor M31, the source of which is connected to the gate of pullup transistor M13. Because all of the four transistors of the first and second sections referred to match each other, the output bias current is established by setting the current through the two "stacked" diode-connected transistors of each of the two sections. A shortcoming of the standard Monticelli class AB output circuits is that the 2*VGS voltage plus the VDSsat voltage across the associated current source is too high (approximately 2.2 volts).

To avoid that problem, voltage level shift resistor R1 is provided. This allows the gate of transistor M2 to be lower than 2*VGS, so a lower power supply voltage can be used.

The current I1 in FIGS. 3 and 4 is established mainly by the circuitry in section 26C which is shown only in FIG. 4. (FIG. 3 does not show how the current I1 is generated or forced through level-shifting resistor R1.) The current through resistor R11 in FIG. 4 is equal to the VGS voltage (i.e., the gate-to-source voltage) of transistor M48 divided by the resistance R11 of resistor R11, and therefore is referred to as a "VGS/R current".

The resistance of voltage level shift resistor R1 (and matching resistor R7 in FIG. 3) is selected so that when the current I1 flows through resistor R1, the greatest voltage drop is developed across level shift resistor R1 at a low temperature. Therefore, at a low temperature the greatest voltage drop is achieved across level shift resistor R1, and at high temperature the lowest voltage drop occurs across level shift resistor R1. As a practical matter, the greatest voltage drop is needed across level shift resistor R1 at the lowest temperatures because that is when the transistor threshold voltages are the greatest and the greatest VGS drive voltages are required for the transistors. The resistance of resistor R11 in FIG. 4 and matching resistor R7 in FIG. 3 is selected to be 300 kilohms. Resistor R11 and transistor M48 in FIG. 4 are used to create a current which tracks the current through resistor R7. In order for the voltage shifter voltages to track, these two currents must also track because they determine how much current flows through resistors R1 and R2.

The above mentioned VGS/R current that flows through resistor R1 in FIG. 4 also flows through transistor M46, and therefore a replica of that same VGS/R current also flows through transistor M62, scaled by the ratio of the channel-width-to-channel-length ratio of transistor M62 to that of transistor M46, and that same current also flows through diode-connected current mirror output transistor M45. Since resistor R7 and pullup transistor M13 in FIG. 3 precisely match resistor R11 and transistor M48 in FIG. 4, respectively, the current I3 in FIG. 3 matches the VGS/R current in resistor R11, and the same value of quiescent bias current flows in transistor M48 and the pullup transistor M13. The current I2 is independent of temperature, and the quiescent current of pulldown transistor M1 (FIG. 3) will track the current I2.

The current through resistor R2 and transistor M4 tracks the current through resistor R11 and P-channel transistors M46, M62, M45, M44 and M47. The currents through transistors M62, M45, M4 and M47 therefore are also stabilized, and can be scaled relative to the VGS/R current in resistor R11 in accordance with their relative channel-width-to-channel-length ratios. The current through transistor M3 tracks the N-channel output transistor M1 in FIG. 3.

The operation of operational amplifier 21 ensures that the drain voltage of transistor M47 is equal to the VGS voltage of N-channel transistor M3. The voltage of the drain of transistor M20 then is equal to the VGS of transistor M3 minus the VGS/R current flowing through transistor M4 times a multiplier and also multiplied by R2. Since resistors R1,R2, R7 and R11 track each other over temperature and process parameters variations, the voltages caused by the VGS/R current flowing through these resistors do not change with temperature.

The current through transistor M19 has whatever value is required by the function of operational amplifier 21 in establishing the voltage of the drain of M47 equal to the VGS voltage of M3. The current through M20 is the sum of the current through transistors M44 and M47. M19 is scaled relative to M20, and I1 results in a "VGS/R current" through level shift resistor R1 of FIG. 3. Since the current of the 300 kilohm resistor R7 in FIG. 3 matches the current through M44 in FIG. 4 (because they both are based on the same VGS/R current through resistor R11 of FIG. 4), that means that the current through level shift resistor R2 in FIGS. 3 and 4 tracks the current through level shift resistor R1 in FIG. 3.

Figure 1:
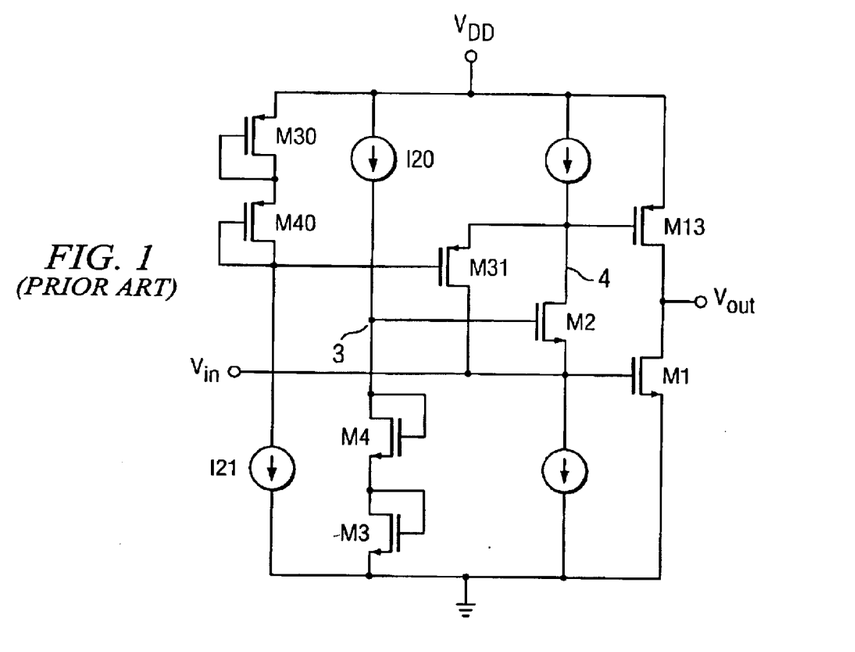
FIG. 1 is a schematic diagram of a prior art Monticelli class AB output stage.

Referring to prior art FIG. 1, note that this is in contrast to the Monticelli reference, wherein, for example, the 2*VGS voltage across transistors M3 and M4 needs to track the 2*VGS voltage developed across the corresponding output transistor M1 and the transistor M2 driving it. It is very desirable that an amplifier have the current in the output leg independent of temperature, power supply, and processing variations, because the amount of current in the output leg determines the amplifier transconductance, and consequently determines the phase margin, speed and stability of the amplifier. By having components track each other over these operating variations, it is possible to accurately control the current in the output leg. It should be understood that providing a voltage shifter introduces additional difficulties in designing the amplifier because it is one more thing that must track with respect to the temperature, power supply, and processing variations.

To summarize, in order to reduce the minimum supply voltage at which the class AB output stage can operate, the invention provides a first voltage shifting circuit 17 between the diode-connected transistors M3 and M4 to provide a reduced but properly tracking reference voltage to the gate of transistor M2, and also provides a second voltage shifting circuit 18 to correspondingly effectively reduce the gate-to-source voltage of transistor M2. This reduces the minimum required power supply voltage over the operating temperature range of –40 to 150 degrees Celsius to a value less than the 2*VGS+VDSsat voltage required by the above mentioned circuit of prior art FIG. 1 without decreasing the speed of the feedback loop.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A class AB output circuit having an input terminal and an output terminal, comprising:
(a) a P-channel first output transistor having a source coupled to a first supply voltage, a drain coupled to the output terminal, and a gate coupled to respond to an input signal on the input terminal, and an N-channel second output transistor having a drain coupled to the output terminal, a source coupled to a second supply voltage, and a gate coupled to respond to the input signal;
(b) a first N-channel transistor having a drain coupled to a gate of the first output transistor and also coupled to the first supply voltage by means of a first current source and a source coupled to the second supply voltage by means of a second current source;
(c) a first diode-connected N-channel transistor, a second diode-connected N-channel transistor, and a first voltage level shifting circuit coupled in series between the second supply voltage and a gate of the first N-channel transistor, and a current source coupled between the first supply voltage and the gate of the first N-channel transistor; and (d) a second voltage level shifting circuit coupled between the gate of the second output transistor and the source of the first N-channel transistor.

2. The class AB output circuit of claim 1 wherein the first voltage level shifting circuit has a first terminal coupled to a gate and drain of the first diode-connected N-channel transistor and a second terminal coupled to a source of the second diode-connected N-channel transistor, a gate and drain of the second diode-connected N-channel transistor being coupled to the gate of the first N-channel transistor, a source of the first diode-connected N-channel transistor being coupled to the second supply voltage.

3. The class AB output stage of claim 2 wherein the first terminal of the first voltage level shifting circuit is connected directly to the gate and drain of the first diode-connected N-channel transistor.

4. The class AB output stage of claim 2 wherein the first terminal of the first voltage level shifting circuit is indirectly coupled to the gate and drain of the first diode-connected N-channel transistor by means of an operational amplifier having a first input connected to the gate and drain of the first diode-connected N-channel transistor and a second input connected to the first terminal of the first voltage level shifting circuit and an output coupled to provide feedback control of the voltage of the second terminal of the first voltage level shifting circuit.

5. The class AB output circuit of claim 2 wherein the first supply voltage is positive relative to the second supply voltage, and wherein the first and second terminals of the first voltage level shifting circuit are (+) and (−) terminals, respectively, and wherein a (+) terminal of the second voltage level shifting circuit is coupled to the gate of the second output transistor and a (−) terminal of the second voltage shifting circuit is coupled to the source of the first N-channel transistor.

6. The class AB output circuit of claim 1 wherein the input signal is coupled directly to the gate of the second output transistor.

7. The class AB output circuit of claim 1 wherein the input signal is coupled indirectly to the gate of the second output transistor.

8. A class AB output circuit having an input terminal and an output terminal, comprising:

(a) a P-channel first output transistor having a source coupled to a first supply voltage and a drain coupled to the output terminal, and an N-channel second output transistor having a drain coupled to the output terminal and a source coupled to a second supply voltage;

(b) a first P-channel transistor having a source coupled to the output terminal and a gate coupled to the input terminal;

(c) a first N-channel transistor having a drain coupled to a gate of the first output transistor and also coupled to the first supply voltage by means of a first resistor and a source coupled to the second supply voltage by means of a second current source;

(d) a first diode-connected N-channel transistor having a source connected to the second supply voltage;

(e) a first voltage level shifting circuit having a (+) terminal coupled to a gate and drain of the first diode-connected N-channel transistor;

(f) a second diode-connected N-channel transistor having a source connected to a (−) terminal of the first voltage level shifting circuit; and (g) a second voltage shifting circuit having a (−) terminal coupled to the gate of the second output transistor and a drain of the first P-channel transistor and a (+) terminal coupled to the source of the first N-channel transistor.

9. The class AB output circuit of claim 8 wherein the first voltage level shifting circuit includes an operational amplifier having a (−) input coupled to the gate and drain of the first diode-connected N-channel transistor and a (+) input coupled to the source of the second diode-connected N-channel transistor.

10. The class AB output circuit of claim 9 wherein the (+) input of the operational amplifier is coupled to the source of the second diode-connected N-channel transistor by means of a first level shifting resistor having a first terminal coupled to the (+) input of the operational amplifier and a second terminal coupled to the source of the second diode-connected N-channel transistor.

11. The class AB output circuit of claim 10 wherein the second voltage level shifting circuit includes a second resistor having a first terminal coupled to the gate of the second output transistor and a second terminal coupled to the source of the first N-channel transistor.

12. The class AB output circuit of claim 11 including a second N-channel transistor having a source coupled to the second supply voltage, a drain coupled to the second terminal of the first voltage level shifting resistor, and a gate coupled to an output of the operational amplifier.

13. The class AB output circuit of claim 12 including a third N-channel transistor having a source coupled to the second supply voltage, a drain coupled to the second terminal of the second voltage level shifting resistor, and a gate coupled to an output of the operational amplifier.

14. The class AB output circuit of claim 11 wherein the resistance of the second resistor tracks the resistance of the first resistor with respect to temperature.

15. The class AB output circuit of claim 13 wherein the output of the operational amplifier performs the function of setting the voltage of the first terminal of the first resistor to be equal to the voltage of the gate and drain of the first diode-connected transistor.

16. A method of operating a class AB output circuit at reduced power supply voltage levels, the class AB output circuit including an input terminal and an output terminal, a P-channel first output transistor having a source coupled to a first supply voltage, a drain coupled to the output terminal, and a gate coupled to respond to an input signal on the input terminal, and an N-channel second output transistor having a drain coupled to the output terminal, a source coupled to a second supply voltage, and a gate coupled to respond to the input signal, a first N-channel transistor having a drain coupled to a gate of the first output transistor and also coupled to the first supply voltage by means of a first current source and a source coupled to the second supply voltage by means of a second current source, a first diode-connected N-channel transistor and a second diode-connected N-channel transistor coupled in a series relationship between the second supply voltage and a gate of the first N-channel transistor, and a current source coupled between the first supply voltage and the gate of the first N-channel transistor, the method comprising:

(a) shifting a first voltage level on the gate and drain of the first diode-connected N-channel transistor by a first predetermined amount to a first lower level and applying the first lower level to the source of the second diode-connected N-channel transistor; and (b) shifting a second voltage level on the gate of the second output transistor by a second predetermined amount to a second lower level and applying the second lower level to the source of the first N-channel transistor.

17. A class AB output circuit for operation at reduced power supply voltage levels, comprising:

an input terminal and an output terminal, a P-channel first output transistor having a source coupled to a first supply voltage, a drain coupled to the output terminal, and a gate coupled to respond to an input signal on the input terminal, and an N-channel second output transistor having a drain coupled to the output terminal, a source coupled to a second supply voltage, and a gate coupled to respond to the input signal, a first N-channel transistor having a drain coupled to a gate of the first output transistor and also coupled to the first supply voltage by means of a first current source and a source coupled to the second supply voltage by means of a second current source;

a first diode-connected N-channel transistor and a second diode-connected N-channel transistor coupled in a series relationship between the second supply voltage and a gate of the first N-channel transistor, and a current source coupled between the first supply voltage and the gate of the first N-channel transistor;

means for shifting a first voltage level on the gate and drain of the first diode-connected N-channel transistor by a first predetermined amount to a first lower level and applying the first lower level to the source of the second diode-connected N-channel transistor; and means for shifting a second voltage level on the gate of the second output transistor by a second predetermined amount to a second lower level and applying the second lower level to the source of the first N-channel transistor.

18. A voltage reference circuit comprising:

(a) a class AB output circuit including
 i. a P-channel first output transistor having a source coupled to a first supply voltage, a drain coupled to the output terminal, and a gate coupled to respond to an input signal on the input terminal, and an N-channel second output transistor having a drain coupled to the output terminal, a source coupled to a second supply voltage, and a gate coupled to respond to the input signal,
 ii. a first N-channel transistor having a drain coupled to a gate of the first output transistor and also coupled to the first supply voltage by means of a first current source and a source coupled to the second supply voltage by means of a second current source,
 iii. a first diode-connected N-channel transistor, a second diode-connected N-channel transistor, and a first voltage level shifting circuit coupled in series between the second supply voltage and a gate of the first N-channel transistor, and a current source coupled between the first supply voltage and the gate of the first N-channel transistor, and
 iv. a second voltage level shifting circuit coupled between the gate of the second output transistor and the source of the first N-channel transistor;

(b) a bandgap reference voltage circuit; and (c) a feedback amplifier including a first input coupled to an output of the bandgap reference voltage circuit, a second input coupled to receive a feedback signal produced in response to an output voltage on the output terminal, and an output coupled to produce the input signal on the input terminal.

19. The reference circuit of claim 18 including a feedback circuit including a first feedback resistor and a second feedback resistor coupled in series between the output terminal and the second supply voltage, the feedback signal being produced at a junction between the first and second feedback resistors.

* * * * *